(12) United States Patent
Guo

(10) Patent No.: US 7,123,452 B2
(45) Date of Patent: Oct. 17, 2006

(54) SPIN-VALVE GMR WITH PATTERNED SYNTHETIC EXCHANGE BIAS

(75) Inventor: Yimin Guo, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 868 days.

(21) Appl. No.: 10/238,707

(22) Filed: Sep. 10, 2002

(65) Prior Publication Data

US 2004/0047084 A1    Mar. 11, 2004

(51) Int. Cl.
*G11B 5/39*    (2006.01)
(52) U.S. Cl. ............................. 360/324.11; 360/324.12; 360/324.2; 428/692; 29/603.14; 29/603.08
(58) Field of Classification Search .................. None
See application file for complete search history.

(56) References Cited

U.S. PATENT DOCUMENTS

| | | | | |
|---|---|---|---|---|
| 5,465,185 A | * | 11/1995 | Heim et al. | 360/324.11 |
| 5,729,411 A | * | 3/1998 | Kishi et al. | 360/327.32 |
| 6,118,624 A | | 9/2000 | Fukuzawa et al. | 360/113 |
| 6,222,707 B1 | | 4/2001 | Huai et al. | 360/324.1 |
| 6,266,218 B1 | * | 7/2001 | Carey et al. | 360/324.12 |
| 6,295,187 B1 | | 9/2001 | Pinarbasi | 360/324.11 |
| 6,303,218 B1 | | 10/2001 | Kamiguchi et al. | 428/332 |
| 6,317,297 B1 | | 11/2001 | Tong et al. | 360/314 |
| 6,322,640 B1 | | 11/2001 | Xiao et al. | 148/308 |
| 6,324,037 B1 | | 11/2001 | Zhu et al. | 360/324.12 |
| 6,331,773 B1 | | 12/2001 | Engel | 324/252 |
| 6,581,272 B1 | * | 6/2003 | Li et al. | 360/324.11 |

OTHER PUBLICATIONS

U.S. Patent Application HT-01-037 to Min Li et al., "Synthetic Pattern Exchange Configuration for Side Reading Reduction", U.S. Appl. No. 10/077,064 filed Feb. 15, 2002.
"Micromagnetic Modeling of Overlaid Exchange-Biased Giant Magnetoresistance Head," by Yuankai Zheng et al., Journal of Applie Physics, vol. 91, No. 10, May 15, 2002, pp. 8287-8289.
U.S. Patent App. Pub. USD 2005/0141149 A1 to Horng et al., Pub. Date Jun. 30, 2005, filed Jan. 14, 2005, US Cl. 360/324.12.

* cited by examiner

*Primary Examiner*—Andrea Wellington
*Assistant Examiner*—Christopher R. Magee
(74) *Attorney, Agent, or Firm*—Saile Ackerman LLC; Stephen B. Ackerman

(57) ABSTRACT

A GMR bottom spin valve sensor longitudinally exchange biased with a zero net magnetic moment biasing multi-layer is provided, together with a method of forming said sensor. The sensor may be additionally biased with a hard biasing layer formed against an abutted junction. The exchange biasing provides the advantages of a highly sensitive free layer in the bottom spin valve sensor element, while producing very strong exchange pinning of the lateral ends of the free layer. The zero net magnetic moment assures stability in the lateral edge and central region of the free layer.

13 Claims, 3 Drawing Sheets

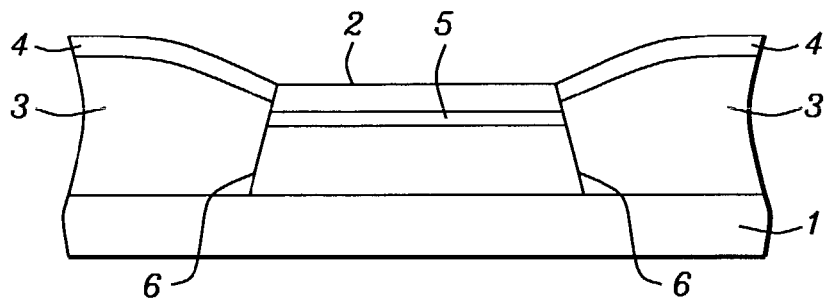
FIG. 1 – Prior Art
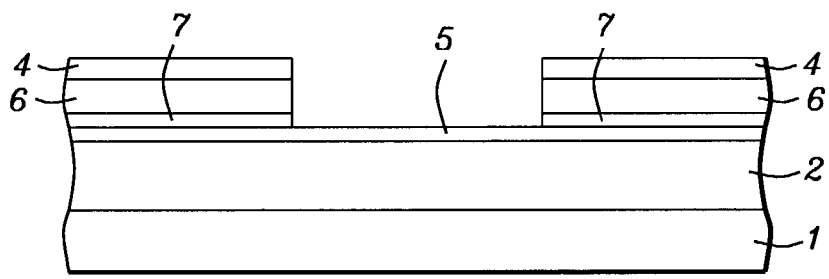
FIG. 2 – Prior Art
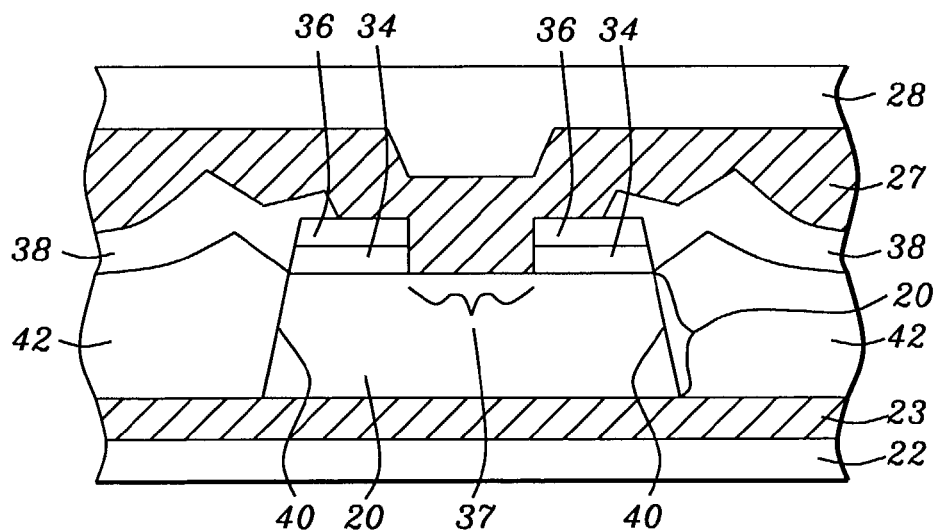
FIG. 3

SPIN-VALVE GMR WITH PATTERNED SYNTHETIC EXCHANGE BIAS

RELATED PATENT APPLICATION

This application is related to Ser. No. 10/077,064, filing date Feb. 15, 2002, assigned to the same assignee as the current invention.

BACKGROUND OF THE INVENTION

1. Field of the Invention

This invention relates generally to the fabrication of a giant magnetoresistive (GMR) read head, more specifically to the use of a synthetic exchange bias structure with zero net magnetic moment to pin the lateral ends of a magnetic free layer in a bottom spin-valve type of GMR head.

2. Description of the Related Art

Magnetic read heads whose sensors make use of the giant magnetoresistive effect (GMR) in the spin-valve configuration (SVMR) base their operation on the fact that magnetic fields produced by data stored in the medium being read cause the direction of the magnetization of one layer in the sensor (the free magnetic layer) to move relative to a fixed magnetization direction of another layer of the sensor (the fixed or pinned magnetic layer). Because the resistance of the sensor element is proportional to the cosine of the (varying) angle between these two magnetizations, a constant current (the sensing current) passing through the sensor produces a varying voltage across the sensor which is interpreted by associated electronic circuitry. The accuracy, linearity and stability required of a GMR sensor places stringent requirements on the magnetization of its fixed and free magnetic layers. The fixed layer, for example, has its magnetization "pinned" in a direction normal to the air bearing surface of the sensor (the transverse direction) by an adjacent magnetic layer called the pinning layer. The free layer is magnetized in a direction along the width of the sensor and parallel to the air bearing surface (the longitudinal direction). Layers of hard magnetic material (permanent magnetic layers) or laminates of antiferromagnetic and soft magnetic materials are typically formed on each side of the sensor and oriented so that their magnetic field extends in the same direction as that of the free layer. These layers, called longitudinal biasing (or bias) layers, maintain the free layer as a single magnetic domain and also assist in linearizing the sensor response by keeping the free layer magnetization direction normal to that of the fixed layer when quiescent (maintaining a stable bias state). Maintaining the free layer in a single domain state significantly reduces noise (Barkhausen noise) in the signal produced by thermodynamic variations in domain configurations. A magnetically stable spin-valve sensor using either hard magnetic biasing layers or ferromagnetic biasing layers is disclosed by Zhu et al. (U.S. Pat. No. 6,324,037 B1) and by Huai et al. (U.S. Pat. No. 6,222,707 B1).

The importance of longitudinal biasing of the free layer has led to various inventions designed to improve the material composition, structure, positioning and method of forming the magnetic layers that produce it. One form of the prior art provides for sensor structures in which the longitudinal biasing layers are layers of hard magnetic material (permanent magnets) that abut the etched back ends of the active region of the sensor to produce what is called an abutted junction configuration. This arrangement fixes the domain structure of the free magnetic layer by magnetostatic coupling through direct edge-to-edge contact at the etched junction between the biasing layer and the exposed end of the layer being biased (the free layer). A schematic illustration of such an abutted junction hard bias configuration is provided by (prior art) FIG. 1. In that figure there is shown a substrate (1) on which has been formed a GMR sensor element (2). The free layer (5) is shown specifically, so it can be seen how the lateral edges of the free layer contact the hard biasing layer (3) along the abutted junction (6). Another form of the prior art, patterned exchange bias, appears in two versions: 1) direct exchange and 2) synthetic exchange (discussed more fully in related application HT 01-037, which is incorporated fully herein by reference). Unlike the magnetostatic coupling resulting from direct contact with a hard magnetic material that is used in the abutted junction, in exchange coupling the biasing layer is a layer of ferromagnetic material which overlays the layer being biased, but is separated from it by a thin coupling layer of non-magnetic material. This non-magnetic gap separating the two layers produces exchange coupling between them, a situation in which it is energetically favorable for the biasing layer and the biased layer assume a certain relative direction of magnetization. In direct exchange coupling, the material used to form the gap (eg. Cu or Ru) and its thickness are chosen to allow a ferromagnetic form of exchange coupling wherein the biasing and biased layers have the same directions of magnetization. A schematic illustration of a direct exchange-biased configuration is shown in (prior art) FIG. 2. In that figure there is shown a substrate (1) on which is formed a sensor element (2). The free layer (5) is shown specifically, so that the exchange biasing layer (6) can be seen above it. There is no abutted junction, rather the biasing layer pins the edges of the free layer by exchange coupling to it across a coupling layer (7). In synthetic exchange coupling, the non-magnetic material of the coupling layer (eg. Cu, Ru or Rh) and its thickness are chosen to allow antiferromagnetic coupling, wherein the magnetization of the biasing and biased layers are antiparallel.

Synthetic antiferromagnetic layers are fairly common in spin-valve fabrications where they are often used as pinned layers. Pinarbasi (U.S. Pat. No. 6,295,187) discusses the virtues of an antiferromagnetically coupled synthetic pinned layer over the single layer pinned layer, pointing out that the antiparallel directions of the two ferromagnetic component layers of the synthetic layer produce a smaller net magnetic moment than a single layer. Engel (U.S. Pat. No. 6,331,773) teaches the formation of a pinned, synthetic antiferromagnet that is itself pinned by a nickle oxide pinning layer. Tong. et al. (U.S. Pat. No. 6,317,297) teaches the formation of a pair of antiferromagnetically coupled synthetic pinned layers that are pinned by the magnetic field of the current through the read head.

Far less common is the use of antiferromagnetic coupling between free layers and longitudinal biasing layers. In this regard, Xiao et al. (U.S. Pat. No. 6,322,640 B1) disclose a method for forming a double, antiferromagnetically biased GMR sensor, using as the biasing material a magnetic material having two crystalline phases, one of which couples antiferromagnetically and the other of which does not. As mentioned above, related patent application HT 01-037 also discusses the use of exchange biasing.

As the area density of magnetization in magnetic recording media (eg. disks) continues to increase, significant reduction in the width of the active sensing region (trackwidth) of read-sensors becomes necessary. For trackwidths less than 0.1 microns (μm), the traditional abutted junction hard bias structure discussed above becomes unsuitable because the strong magnetostatic coupling at the junction surface actually pins the magnetization of the very narrow biased layer (the free layer), making it less responsive to the signal being read and, thereby, significantly reducing the sensor sensitivity. This adverse pinning effect is discussed by Fukuzawa et al. (U.S. Pat. No. 6,118,624) who provide a mechanism for alleviating it by use of a hard magnetic biasing film which has a higher saturation magnetism than the free layer being biased.

Under very narrow trackwidth conditions, the exchange bias method becomes increasingly attractive, since the free layer is not reduced in size by the formation of an abutted junction, but extends continuously across the entire width of the sensor element. As has already been discussed above, FIG. 1 is a schematic depiction of an abutted junction arrangement and FIG. 2 is an equally schematic depiction of a direct exchange coupled configuration. As can be seen, the trackwidth in the abutted junction is made narrow by physically etching away both ends of the sensor to form the junction (FIG. 1 (6)), whereas in the exchange coupled sensor, the trackwidth is defined by placement of the conductive leads and bias layers while the free layer (FIG. 2 (5)) of the sensor element retains its full width.

The present invention combines the strength of an abutted junction hard magnetic biasing configuration with the narrow trackwidth and edge pinning benefits of a synthetic exchange biasing configuration. Moreover, the synthetic exchange biasing layer is formed with zero net magnetic moment, so it can achieve the edge pinning in an extremely stable manner and provide the free layer with an extremely stable bias state.

SUMMARY OF THE INVENTION

It is a first object of the present invention to provide a magnetically stable, synthetic exchange longitudinally biased GMR sensor having a stable bias state and increased sensitivity.

It is a second object of the present invention to provide such a longitudinally biased GMR sensor with strong edge pinning of its free layer yet with a sensitive read width portion.

It is a third object of the present invention to provide such a longitudinally biased GMR sensor with strong edge pinning of its free layer, a sensitive read width portion and the further advantages of a zero net magnetic moment bias layer.

It is a fourth object of the present invention to provide such a synthetic exchange biased GMR sensor which has a very narrow, well defined trackwidth, typically less than 0.1 microns.

It is a fifth object of the present invention to provide a read head producing a high amplitude signal with minimal signal strength variations.

It is a sixth object of the present invention to provide a method for forming such a synthetic exchange biased GMR sensor that can be easily extended to a variety of head designs.

The objects of this invention will be achieved with the formation of a synthetic exchange biased spin valve magnetoresistive sensor (SVMR) of the bottom spin valve configuration, having a synthetic antiferromagnetically coupled pinned layer and a ferromagnetic free layer that is longitudinally biased by exchange coupling to a patterned synthetic antiferromagnetic multi-layer structure having zero net magnetic moment. The stability of this zero net magnetic moment synthetic antiferromagnetic multi-layer is a result of a novel configuration of exchange coupled ferromagnetic layers separated by non-magnetic coupling layers and an antiferromagnetic layer as will be fully described below. In addition to this exchange coupling, which provides a stable bias point and strong edge pinning of the free layer magnetic moment, there is also formed an abutted junction hard bias layer to further improve the magnetic stability of the free layer. Although the objects of the invention could be met without the addition of the hard bias layer, it is found that the addition of such a layer offers a significant improvement. The GMR head is also furnished with a conducting lead layer that is formed over the hard bias abutted junction and the synthetic exchange bias layer.

BRIEF DESCRIPTION OF THE DRAWINGS

FIG. 1 is a schematic drawing of a prior art abutted junction hard-biased GMR read head.

FIG. 2 is a schematic drawing of a prior art exchange biased GMR read head.

FIG. 3 is a schematic drawing of the read head formed in accord with the objects of the present invention.

DESCRIPTION OF THE PREFERRED EMBODIMENT

Figure 4A:
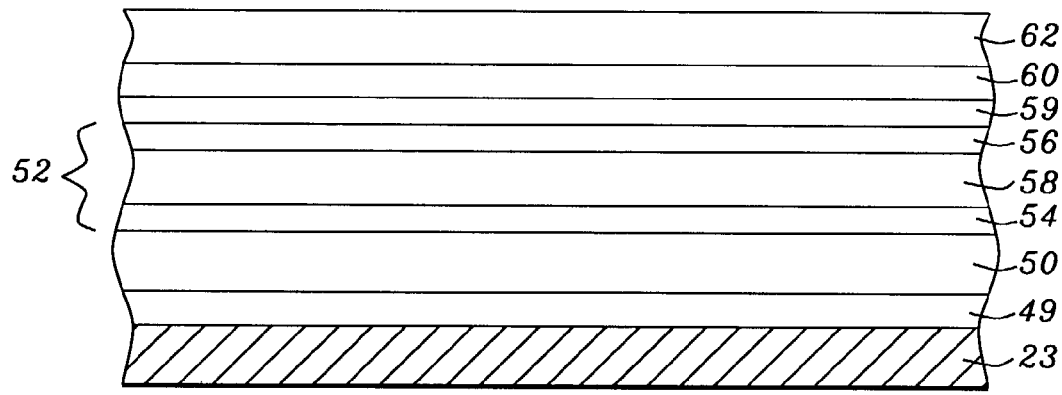
FIGS. 4a, b, c and d are a sequence of schematic drawings showing the formation of the GMR sensor element in the read head of FIG. 3.

The preferred embodiment of the present invention is a spin valve magnetoresistive (SVMR) sensor of the single bottom spin valve type, having its free layer longitudinally biased by exchange coupling with a synthetic antiferromagnetic layer having zero net magnetic moment. To further improve stability, the sensor can also incorporate a longitudinal hard biasing layer in an abutted junction configuration. The sensor can be formed between a top and bottom shield to form a GMR read head.

Referring first to FIG. 3, there is shown a schematic cross-sectional drawing of a SVMR sensor of the bottom spin valve type ("bottom" referring to the position of the pinned layer) formed according to a preferred embodiment of the present invention in which there is both the exchange coupled bias layer (34) and an abutted junction hard bias layer (42). The sensor is formed within a read head which comprises the sensor element (20) formed between a bottom shield (22) and a top shield (28) and insulated from each of the shields by a corresponding dielectric gap layer, (23) and (27). Typical gap layers would be layers of alumina formed to thicknesses between approximately 100 and 400 angstroms.

A patterned synthetic exchange coupled biasing multi-layer (34) and overlying lead layer (36), has been formed on the sensor (20) as two separated, laterally disposed portions on the opposite lateral edges of upper surface of the sensor element. This is done by first covering the entire upper surface of the element with the two layers and then etching away a portion to define a read width portion of the sensor (37) and to leave the separated portions. This process will be discussed below with reference to FIG. 4c. After this patterning of the biasing layer is completed, the lateral edges of the sensor are etched again to define abutted junctions (40) against which a hard bias layer (42) is formed. A second lead layer (38) is formed overlaying the hard bias layer and partially covering the overlaying lead layer (36) of the synthetic exchange coupled bias layer.

Referring next to FIG. 4a, there is shown, in more detail, the process by which the sensor element of FIG. 3 is formed and the process by which the exchange biasing multi-layer is formed and patterned. There is first formed on a substrate, (which in this embodiment is a dielectric layer (23)), a seed layer (49), which can be a layer of giant magnetoresistive (GMR) property enhancing material chosen from the group of such materials consisting of NiFeCr, NiCr or bi-layers of such materials such as NiFeCr/NiFe or NiCr/NiFe, formed to a thickness of between approximately 10 and 60 angstroms. On this seed layer is then formed a pinning layer (50) of antiferromagnetic material such as PtMn or NiMn, typically formed to a thickness between approximately 70 and 250 angstroms. On the pinning layer is then formed a pinned layer (52), which is a synthetic antiferromagnetic layer comprising a pair of ferromagnetic layers (54&56) antiferromagnetically coupled across a coupling layer (58). The ferromagnetic layers are preferentially layers of CoFe formed to a thickness of between approximately 10 and 30 angstroms, while the coupling layer is typically a layer of Ru or Rh, formed to a thickness of between approximately 5 and 9 angstroms for a Ru layer or between approximately 3 and 7 angstroms for a Rh layer. A non-magnetic spacer layer (59) is formed on the pinned layer, the spacer layer being preferentially a Cu layer formed to a thickness of between approximately 10 and 30 angstroms. A ferromagnetic free layer (60) is then formed over the pinned layer, the free layer being a layer (or multilayer) of ferromagnetic material such as CoFe, CoFe/NiFe, CoFe/NiFe/CoFe formed to a thickness between approximately 10 and 50 angstroms. A synthetic exchange coupled multilayer (62) is then formed over the free layer. This multilayer is exchange coupled internally to form an antiferromagnetic configuration of its ferromagnetic layers and it is also exchange coupled to the ferromagnetic free layer upon which it is formed.

Figure 4B:
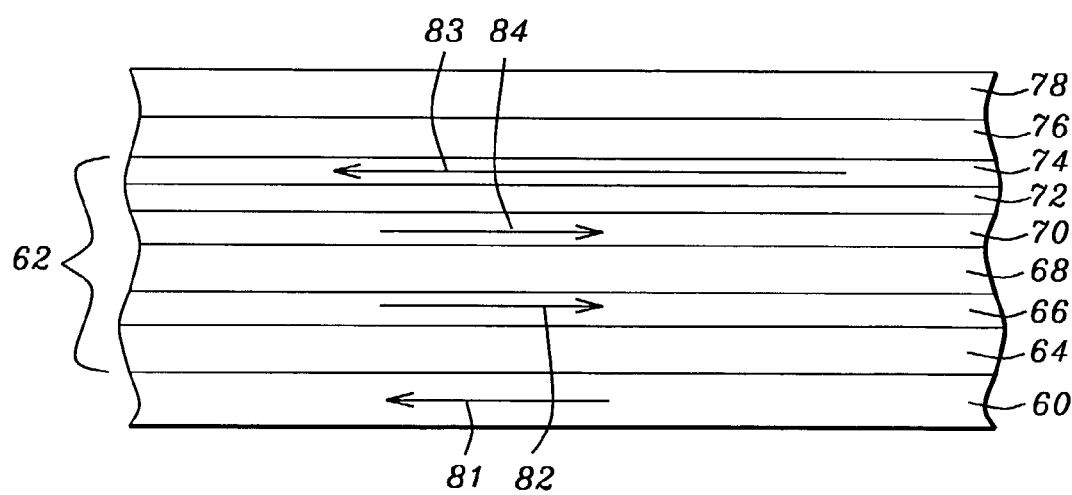

Referring next to FIG. 4b, there is shown a schematic cross-sectional view of the multi-layer and the free layer (60) beneath it. The first coupling layer (64), which is the non-magnetic layer formed on the free layer, is a layer of coupling material such as Ru or Rh. A Ru layer can be formed with a thickness between approximately 5 and 9 angstroms, with 7.5 angstroms being preferred, whereas a Rh layer can be formed with a thickness between approximately 4 and 6 angstroms, with 5 angstroms being preferred. This layer will permit exchange coupling of the multi-layer to the free layer. On the coupling layer (64) is then formed a first ferromagnetic layer (66), which can be a layer of either CoFe or Co, formed to the same thickness in a range between approximately 10 and 20 angstroms, with approximately 15 angstroms being preferred. On this layer is then formed an antiferromagnetic layer (68), which can be a layer of IrMn formed to a thickness between approximately 40 and 50 angstroms. On the antiferromagnetic layer is then formed a second ferromagnetic layer (70), which is a layer of CoFe or Co, formed to the same thickness range between approximately 10 and 20 angstroms with approximately 15 angstroms being preferred. On this layer is then formed a second coupling layer (72), which is a layer of antiferromagnetically coupling material such as Ru or Rh, wherein the Ru layer can be formed with a thickness between approximately 5 and 9 angstroms, with 7.5 angstroms being preferred, whereas a Rh layer can be formed with a thickness between approximately 4 and 6 angstroms, with 5 angstroms being preferred. Finally, there is formed a third ferromagnetic layer (74), which can be a layer of CoFe or Co, formed to the same thickness range between approximately 20 and 40 angstroms with approximately 30 angstroms being preferred. The exchange coupled biasing multilayer is thereby completed. Over the completed multi-layer there is formed a capping layer (76), which is typically a layer of Ta formed to a thickness between approximately 20 and 50 angstroms and over this capping layer there is formed a conducting lead layer which is typically a layer of Au (78) formed to a thickness of between approximately 100 and 300 angstroms. Annealing the fabrication in a longitudinally directed magnetic field of between approximately 300 and 2000 Oe at a temperature of between approximately 150° and 280° C. will set the magnetic moments of the layers as indicated by arrows (81), (82) and (83) in the figure. The first ferromagnetic layer (66) is exchange coupled antiferromagnetically to the free layer (60), so their magnetic moments (82) and (81) respectively, are oppositely directed, while the second and third ferromagnetic layers are antiferromagnetically exchange coupled to each other, as indicated by their oppositely directed magnetic moments, labeled (84) and (83) respectively. Because of the thicknesses of the first, second and third ferromagnetic layers, the sum of their respective magnetizations, (82) plus (83) plus (84), within the multilayer produce a zero net magnetic moment. Note that the annealing process described above is subsequent to an annealing process that sets the magnetization of the pinned layer in the sensor element (layer (52) in FIG. 3). This annealing process is not described as it is well known in the art.

Figure 4C:
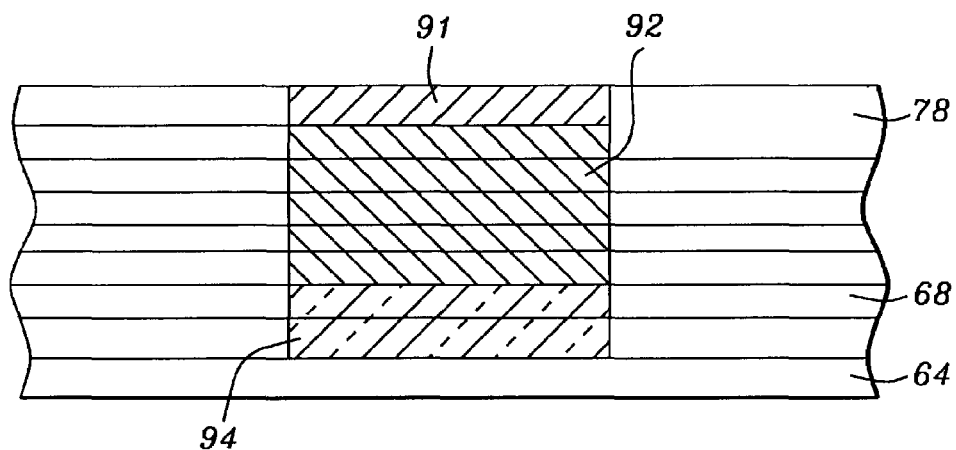

Referring next to FIG. 4c, there is shown a schematic drawing through which can be described the processes of patterning the exchange coupled bias multi-layer. A photolithographic lift-off process (utilizing, for example, an upper layer of photoresist on an undercut pedestal of PMGI, as is known in the art) is now used to etch away the Au lead layer (78) within the required read-width region. The removed region is shown as shaded (91) by diagonal lines in one direction. After removing the Au, a reactive ion etch (RIE) is used to partially remove the exchange bias multi-layer to a depth approximately in the middle of the IrMn layer (68). This removed region is shown as shaded (92) by oppositely directed diagonal lines. Finally, using a RIE with added oxygen, the remainder of the multilayer is etched and oxidized down to the first coupling layer (64), but not including it. This region, which is not physically removed but remains in an oxidized form, is shown shaded by broken diagonal lines as (94).

Figure 4D:
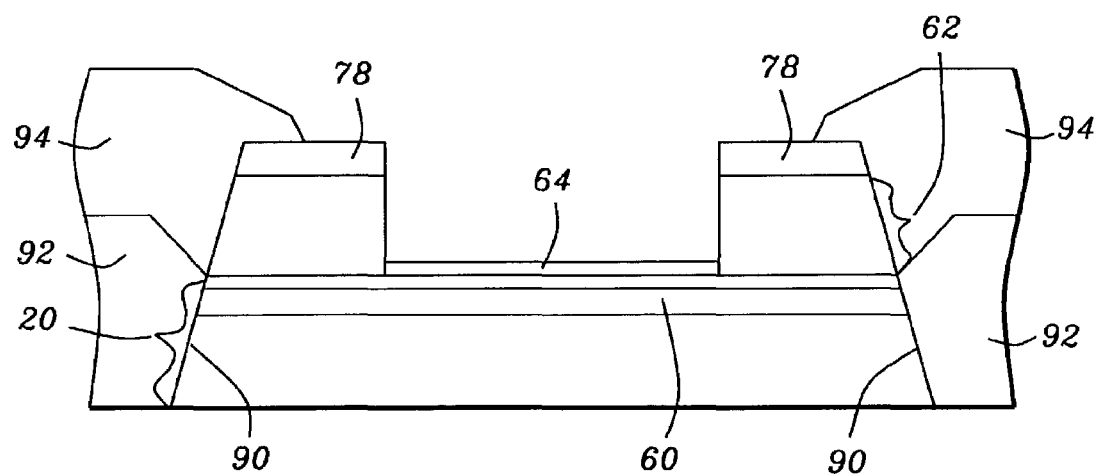

Referring next to FIG. 4d, there is shown the fabrication of FIG. 4c wherein abutted junctions (90) have been formed on each lateral end of the fabrication by etching through the lead layer (78), the bias layer (62) and the sensor element (20). The capping layer (64) and the free layer (60) are also shown). A hard magnetic biasing material (92), such as CoCrPt, can be deposited against the abutted junction, to increase the longitudinal biasing effect of the exchange coupled multi-layer. Subsequent to the deposition of the hard biasing layer, a second conductive lead layer (94) can be deposited over the hard biasing material and partially over the conductive lead layer remaining on the exchange biasing multi-layer (96). It is to be noted that the additional hard bias layer can be omitted and the objects of the present invention would still be met with the use of only the exchange coupled biasing layer. It is to be noted that the hard bias layer is optional and, if it is not formed, then the abutted junction need not be formed either and the lead layer (94) would be formed only over the exchange bias layer (78).

As is understood by a person skilled in the art, the preferred embodiment of the present invention is illustrative of the present invention rather than being limiting of the present invention. Revisions and modifications may be made to methods, processes, materials, structures, and dimensions through which is formed a spin valve sensor with a patterned synthetic exchange biasing multi-layer having zero net magnetic moment, while still providing a spin valve sensor with a patterned synthetic exchange biasing multi-layer having zero net magnetic moment, formed in accord with the present invention as defined by the appended claims.

What is claimed is:

1. A spin valve sensor having a patterned synthetic antiferromagnetic exchange biasing multi-layer with a zero net magnetic moment, comprising:
   a substrate
   a bottom spin valve sensor element formed on the substrate;
   a patterned synthetic antiferromagnetic biasing multi-layer exchange coupled to said sensor element and having, thereby, a net magnetic moment which is substantially zero;
   a capping layer formed on said patterned biasing layer;
   a conducting lead layer formed on said capping layer.

2. The sensor of claim 1 wherein the bottom spin valve sensor element comprises;
   a seed layer;
   an antiferromagnetic pinning layer formed on the seed layer;
   a synthetic antiferromagnetic pinned layer formed on the pinning layer;
   a non-magnetic spacer layer formed on said pinned layer;
   a ferromagnetic free layer formed on said spacer layer.

3. The sensor of claim 2 wherein the sensor element seed layer is a layer chosen from the group of GMR property enhancing materials including NiFeCr, NiCr, and the multilayers of such materials NiFeCr/NiFe and NiCr/NiFe.

4. The sensor of claim 2 wherein the ferromagnetic free layer is a layer of ferromagnetic material chosen from the group of ferromagnetic materials including, Co, CoFe, and the multilayers of such materials CoFe/NiFe and CoFe/NiFe/CoFe.

5. The sensor of claim 2 wherein the zero magnetic moment synthetic antiferromagnetic biasing multi-layer comprises:
   a first antiferromagnetically coupling layer formed on the free ferromagnetic layer of said bottom spin valve sensor element;
   a first ferromagnetic layer formed on the first coupling layer and antiferromagnetically exchange coupled to the ferromagnetic free layer of the sensor element;
   an antiferromagnetic layer formed on the first ferromagnetic layer;
   a second ferromagnetic layer formed on the antiferromagnetic layer;
   a second antiferromagnetically coupling layer formed on the second ferromagnetic layer;
   a third ferromagnetic layer antiferromagnetically exchange coupled to the second ferromagnetic layer; and
   wherein the magnetic moments of the first and second ferromagnetic layers are substantially equal and directed opposite to the magnetic moment of the third ferromagnetic layer and wherein the sum of the three magnetic moments is substantially zero.

6. The sensor of claim 5 wherein the first and second ferromagnetic layers of the biasing multi-layer are layers of Co or CoFe.

7. The sensor of claim 6 wherein the first and second ferromagnetic layers of the biasing multi-layer are formed to a thickness of between approximately 10 and 30 angstroms.

8. The sensor of claim 7 wherein the third ferromagnetic layer of the biasing multi-layer is chosen to have a magnetic moment that is equal and opposite to the sum of the magnetic moments of the first and second ferromagnetic layers.

9. The sensor of claim 8 wherein the third ferromagnetic layer of the biasing multi-layer is a layer of Co or CoFe.

10. The sensor of claim 9 wherein the third ferromagnetic layer of the biasing multi-layer is formed to a thickness between approximately 20 and 60 angstroms.

11. The biasing multi-layer of claim 10 wherein it is patterned to form two laterally separated portions of substantially equal dimension, one portion being on each lateral end of the bottom spin-valve sensor element and wherein the separation of the two portions define the track-width of the head.

12. The sensor of claim 4 further comprising:
   a hard bias layer formed abutting the lateral ends of said sensor element in an abutted junction configuration and also abutting the lateral ends of said exchange coupled biasing layer, said capping layer and said lead layer;
   a second lead layer formed over said hard bias layer and extending over a portion of said first lead layer.

13. The sensor of claim 12 formed between a lower magnetic shield and an upper magnetic shield and being insulated from each shield by a dielectric layer, forming, thereby, a GMR bottom spin-valve read head.

* * * * *